(12) United States Patent
Huang et al.

(10) Patent No.: US 8,649,178 B2
(45) Date of Patent: Feb. 11, 2014

(54) HEAT DISSIPATION MODULE FOR ELECTRONIC APPARATUS

(75) Inventors: Ching-Yuan Huang, Taipei (TW); Chang-Yuan Wu, Taipei (TW); I-Feng Hsu, Taipei (TW); Tzu-Chang Chen, Taipei (TW)

(73) Assignee: Compal Electronics, Inc., Taipei (TW)

( * ) Notice: Subject to any disclaimer, the term of this patent is extended or adjusted under 35 U.S.C. 154(b) by 219 days.

(21) Appl. No.: 12/944,727

(22) Filed: Nov. 12, 2010

(65) Prior Publication Data
US 2011/0116238 A1 May 19, 2011

Related U.S. Application Data

(60) Provisional application No. 61/262,563, filed on Nov. 19, 2009.

(51) Int. Cl.
*H05K 7/20* (2006.01)
(52) U.S. Cl.
USPC ...... 361/709; 361/679.54; 361/708; 361/710; 361/719
(58) Field of Classification Search
USPC ............... 361/679.46–679.54, 688, 704–710, 361/714–720, 726, 727
See application file for complete search history.

(56) References Cited

U.S. PATENT DOCUMENTS

| | | | |
|---|---|---|---|
| 6,125,035 A * | 9/2000 | Hood et al. | 361/679.47 |
| 6,432,497 B2 | 8/2002 | Bunyan | |
| 7,356,277 B2 | 4/2008 | Iijima et al. | |
| 7,440,279 B2 * | 10/2008 | Lai et al. | 361/700 |
| 7,518,868 B2 * | 4/2009 | Farrow et al. | 361/700 |
| 7,621,316 B2 * | 11/2009 | Kawabata et al. | 165/80.3 |
| 7,773,375 B1 * | 8/2010 | Faucett | 361/679.49 |
| 7,779,638 B2 * | 8/2010 | Sauciuc et al. | 62/3.2 |
| 2004/0052052 A1 * | 3/2004 | Rivera | 361/700 |
| 2008/0130221 A1 * | 6/2008 | Varadarajan et al. | 361/687 |

FOREIGN PATENT DOCUMENTS

| | | |
|---|---|---|
| TW | 200745307 | 12/2007 |
| TW | M357188 | 5/2009 |

OTHER PUBLICATIONS

"Office Action of Taiwan Counterpart Application", issued on Apr. 24, 2013, pp. 1-8.

* cited by examiner

*Primary Examiner* — Courtney Smith
(74) *Attorney, Agent, or Firm* — Jianq Chyun IP Office (57) ABSTRACT

A heat dissipation module for an electronic apparatus including a heat-generating structure is provided. The heat dissipation module includes a heat dissipation structure and a heat-conducting structure. The heat-conducting structure includes a heat-conducting portion and an extending portion. The heat-conducting portion is adhered between the heat-generating structure and the heat dissipation structure. The heat generated by the heat-generating structure is transmitted to the heat dissipation structure through the heat-conducting portion. The extending portion is connected to the heat-conducting portion and exposed to the heat-generating structure and the heat dissipation structure. When the extending portion is forced to move along a direction away from the heat-generating structure and the heat dissipation structure, the heat-conducting portion is deformed to release the adhesion between the heat-conducting portion and the heat-generating structure and the adhesion between the heat-conducting portion and the heat dissipation structure.

14 Claims, 8 Drawing Sheets

HEAT DISSIPATION MODULE FOR ELECTRONIC APPARATUS

CROSS-REFERENCE TO RELATED APPLICATION

This application claims the priority benefit of U.S. provisional application Ser. No. 61/262,563, filed on Nov. 19, 2009. The entirety of the above-mentioned patent application is hereby incorporated by reference herein and made a part of this specification.

BACKGROUND OF THE INVENTION

1. Field of the Invention

The invention relates to a heat dissipation module and an electronic apparatus applying the heat dissipation module.

2. Description of Related Art

With the progress of the electronic technology, dazzling novel electronic products have been launched on the market to meet the consumer demands. In terms of computer, to assure a computer system being normally running, an electronic apparatus with a higher heat power in the computer system, such as a central processing unit (CPU), a memory module, a graphics processing unit (GPU) and a chipset, must be equipped with a heat dissipation module for removing the unwanted heat energy outwards and preventing the temperature of electronic devices in operations from exceeding a normal operation temperature limit.

Specifically, the heat dissipation module comprises heat sink and heat-conducting structure, wherein the heat-conducting structure is disposed between the heat sink and the electronic device so that heat generated by the electronic devices can be transmitted to the heat sink through the heat-conducting structure. The heat-conducting structure can be fixed on the heat sink and the electronic device by adhesion. However, when a rework of the heat dissipation module is necessary due to assembling faults or other factors, the aforementioned fixing method using adhesion leads to the difficulty in detaching the heat dissipation module or the problem of glue residual after the heat dissipation module is disassembled.

SUMMARY OF THE INVENTION

The invention provides a heat dissipation module which is easy to be reworked.

The invention provides an electronic apparatus having heat dissipation module, which is easy to be reworked.

The present invention provides a heat dissipation for an electronic apparatus. The electronic apparatus comprises a heat-generating structure. The heat dissipation module comprises a heat dissipation structure and a heat-conducting structure. The heat-conducting structure comprises a heat-conducting portion and an extending portion. The heat-conducting portion is the portion with adhesion. The heat-conducting portion is adhered between the heat-generating structure and the heat dissipation structure, wherein the heat generated by the heat-generating structure is transmitted to the heat dissipation structure through the heat-conducting portion. The extending portion is connected to the heat-conducting portion and is exposed to the heat-generating structure and the heat dissipation structure. When the extending portion is forced to deform the adhesive heat-conducting portion adhered between the heat-generating structure and the heat dissipation structure, an adhesion between the adhesive heat-conducting portion and the heat-generating structure is released due to deformation of the adhesive heat-conducting portion. According to various product designs, the extending portion is forced to deform the adhesive heat-conducting portion along a direction parallel to the adhesive interface (such as the first adhesive layer or the second adhesive layer), which leads to relief of the adhesion between the adhesive heat-conducting portion and the heat-generating structure. When the adhesion between the adhesive heat-conducting portion and the heat-generating structure is released, the adhesion between the heat-conducting portion and the heat dissipation structure is released simultaneously.

Accordingly, the heat-conducting structure of the present invention comprises the adhesive heat-conducting portion and the extending portion which are connected to each other, wherein the heat-conducting portion is adhered between the heat dissipation structure and the heat-generating structure, and the extending portion is exposed to the heat dissipation structure and the heat-generating structure. The extending portion is forced to drive the heat-conducting portion to be deformed so that the adhesion between the heat-conducting portion and the extending portion and the adhesion between the heat-conducting portion and the heat dissipation structure are released. Accordingly, it is easy to detach the heat-conducting structure from the heat dissipation structure and the heat-generating structure so that it is easy to rework the heat dissipation module.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
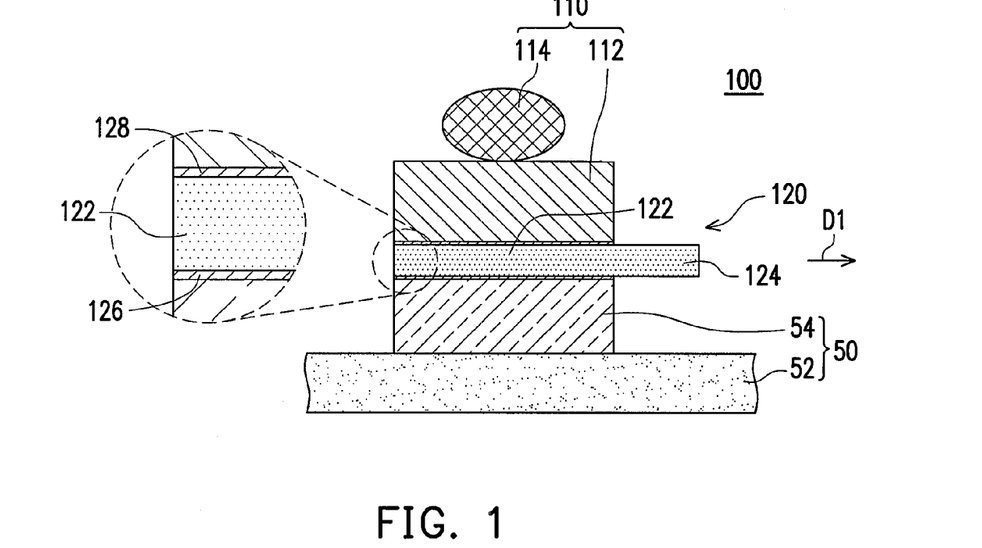
FIG. 1 is a schematic cross-sectional view showing a heat dissipation module according to one embodiment of the present invention.
Figure 2:
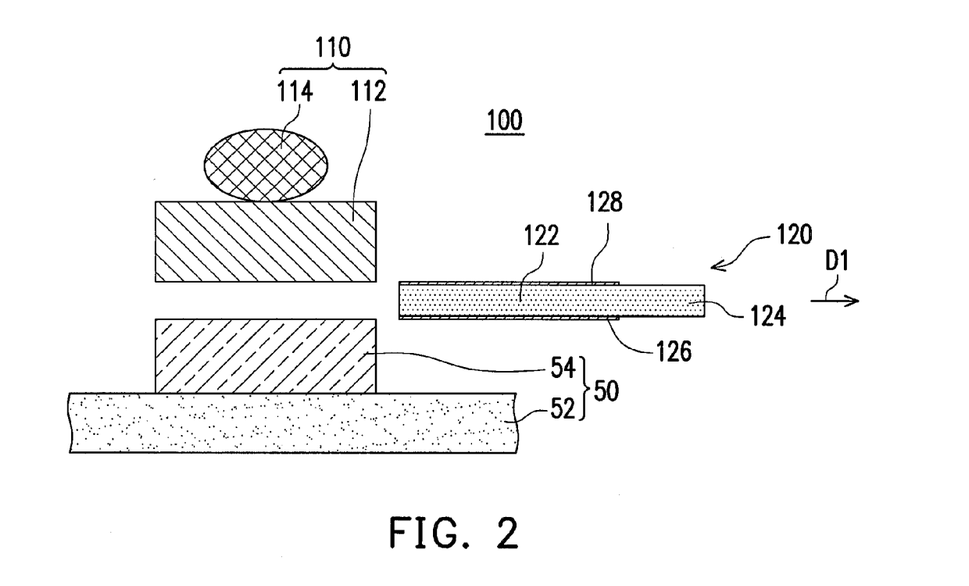
FIG. 2 is a schematic view showing a heat-conducting structure in FIG. 1, which is separated from a heat dissipation structure and a heat-generating structure.

FIG. 1 is a schematic cross-sectional view showing a heat dissipation module according to one embodiment of the present invention. FIG. 2 is a schematic view showing a heat-conducting structure in FIG. 1, which is separated from a heat dissipation structure and a heat-generating structure. As shown in FIG. 1 and FIG. 2, a heat dissipation module 100 of the present embodiment comprises a heat dissipation structure 110 and a heat-conducting structure 120. The heat-conducting structure 120 comprises a heat-conducting portion 122 with adhesive property, and an extending portion 124. The heat-conducting portion 122 is adhered between a heat-generating structure 50 and the heat dissipation structure 110, wherein the heat generated by the heat-generating structure 50 is transmitted to the heat dissipation structure 110 through the heat-conducting portion 122.

The extending portion 124 is connected to the heat-conducting portion 122 and is exposed to the heat-generating structure 50 and the heat dissipation structure 110. When the extending portion 124 is forced to deform the adhesive heat-conducting portion 122 between the heat-generating structure 50 and the heat dissipation structure 110, the adhesion between the adhesive heat-conducting portion 122 and the heat-generating structure 50 is released due to the deformation of the heat-conducting portion 122. According to various product designs, in the embodiment of the present invention, when the extending portion 124 is formed to move along a direction D1, the adhesive heat-conducting portion 122 is deformed along the adhesive interface, which leads to relief of the adhesion between adhesive heat-conducting portion 122 and the heat-generating structure 50. With the various product designs, when the adhesion between the adhesive heat-conducting portion 122 and the heat-generating structure 50 is released, the adhesion between the heat-conducting portion 122 and the heat dissipation structure 110 is released simultaneously, which does not limit the scope of the present invention. Accordingly, the user can pull the extending portion 124 along the direction D1 to drive the heat-conducting portion 122 to be deformed so as to release the adhesion between the heat-conducting portion 122 and the heat-generating structure 50 and the adhesion between the heat-conducting portion 122 and the heat dissipation structure 110. Therefore, it is easy to separate the heat-conducting structure 120 from the heat-generating structure 50 and the heat dissipation structure 110 (as shown in FIG. 2). Thus, it is easy to rework the heat dissipation module 100. With the different requirements of the manufacturing process, the heat-conducting structure 120 is forced to be deformed so as to detach from the heat-generating structure 50 but still attach to the heat dissipation structure 110. Therefore, the rework of the heat dissipation module 100 can be speeded up.

In the present embodiment, the heat-generating structure 50 comprises a circuit board 52 and a heat-generating device 54. The heat-generating device 54 can be, for example, a central processing unit (CPU), a memory module, a graphics processing unit (GPU) or a chipset. The heat-generating structure 50 and the heat dissipation module 100 together form an electronic apparatus as a part of the electronic device such as a notebook computer.

As shown in FIG. 1, specifically, the heat-conducting portion 122 of the present embodiment further comprises a first adhesive layer 126 and a second adhesive layer 128. The first adhesive layer 126 is disposed between the heat-generating device 54 and the heat-conducting portion 122 and is the adhesive interface beteen the heat-generating device 54 and the heat-conducting portion 122. The second adhesive layer 128 is disposed between the heat dissipation structure 110 and the heat-conducting portion 122 and is the adhesive interface between the heat dissipation structure 110 and the heat-conducting portion 122 so that the heat-generating device 54 and the heat dissipation structure 110 are adhered to the heat-conducting portion 122 through the first adhesive layer 126 and the second adhesive layer 128 respectively.

Moreover, the heat dissipation structure 110 comprises a heat sink 112 and a heat pipe 114. The heat sink 112 is adhered to the heat-conducting portion 122 and the heat pipe 114 is disposed on the heat sink 112, wherein the heat dissipation can be performed by transmitting the heat generated by the heat-generating structure 50 to the heat pipe through the heat-conducting portion 122 and the heat sink 112 in sequence.

The materials of the first adhesive layer 126 and the second adhesive layer 128 can be, for example, the materials with relatively high thermal conductivity so that the heat dissipation efficiency of the heat dissipation module 100 can be improved. Furthermore, the first adhesive layer 126 and the second adhesive layer 128 can have the characteristics similar to or as same as the easily-removable characteristic of the traceless adhesive strip manufactured by 3M corporation so that it is easy to detach the aforementioned heat-conducting structure 120. With the different requirements of the products, the first adhesive layer 126 and the second adhesive layer 128 can be made of the same materials and the different materials, which does not limit the scope of the present invention.

The adhesive heat-conducting portion of the present invention is different from the well-known traceless adhesive strip in that the traceless adhesive strip is not a good heat conductor and the heat resistant ability is no more than 50 degrees centigrade. When the temperature of the traceless adhesive strip is over 50 degrees centigrade, the adhesion of the traceless adhesive strip is degraded and even disappeared and the normal function of the traceless adhesive strip is affected. However, the operation temperature of the heat-generating structures in the average computers is usually over 50 degrees centigrade. Therefore, the commercialized traceless adhesive strip cannot be used in the present invention.

The adhesive heat-conducting portion of the present invention possesses the easily-removable characteristic as same as that of the traceless adhesive strip and the heat resistance ability is no less than 100 centigrade. Moreover, the thermal conductivity coefficient of the heat-conducting portion is larger than 0.8 W/(m·K) due to introduction of the heat-conducting material into the manufacturing process of the heat-conducting portion and the heat conducting coefficient of the heat-conducting portion is large enough to replace the thermal paste (of which the thermal conductivity coefficient is about 0.7-3 W/(m·K)) in the use of thermal dissipation of the electronic elements. Hence, when the adhesive heat-conducting portion is used as the adhesion material between the heat-generating structure and the heat dissipation structure, the heat-conducting portion can rapidly transmit the heat of the heat-generating structure to the heat dissipation structure without affecting the adhesion of the adhesive heat-conducting portion.

Figure 3:
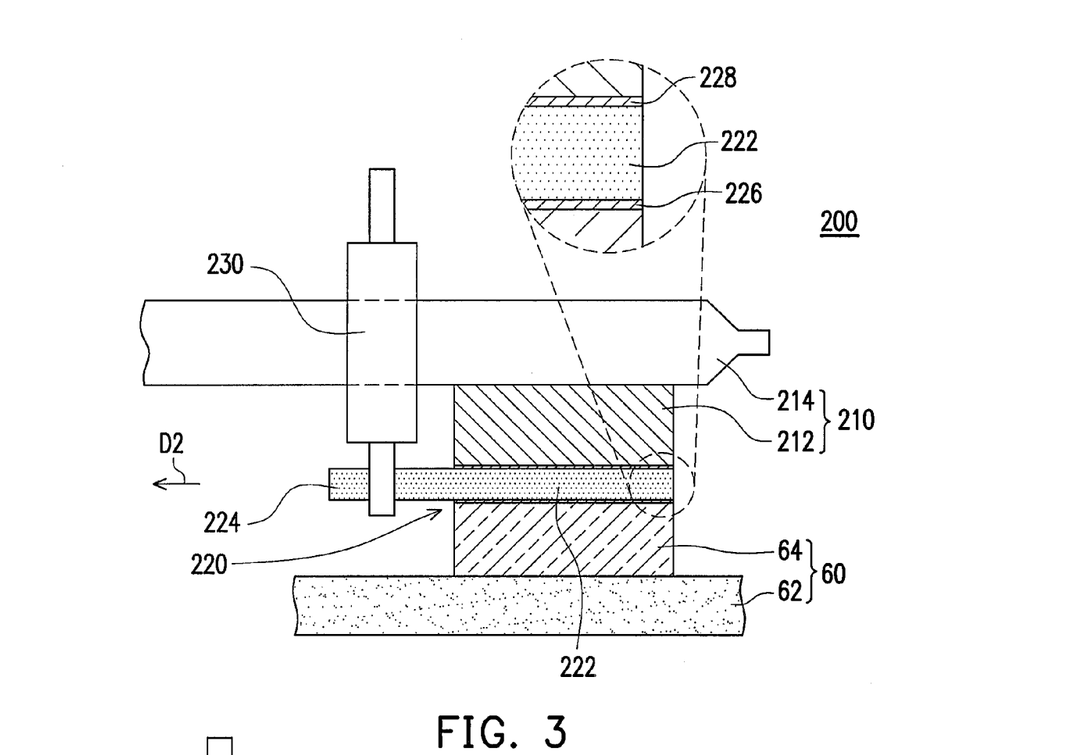
FIG. 3 is a schematic cross-sectional view showing portion components of a heat dissipation module according to another embodiment of the present invention.
Figure 4:
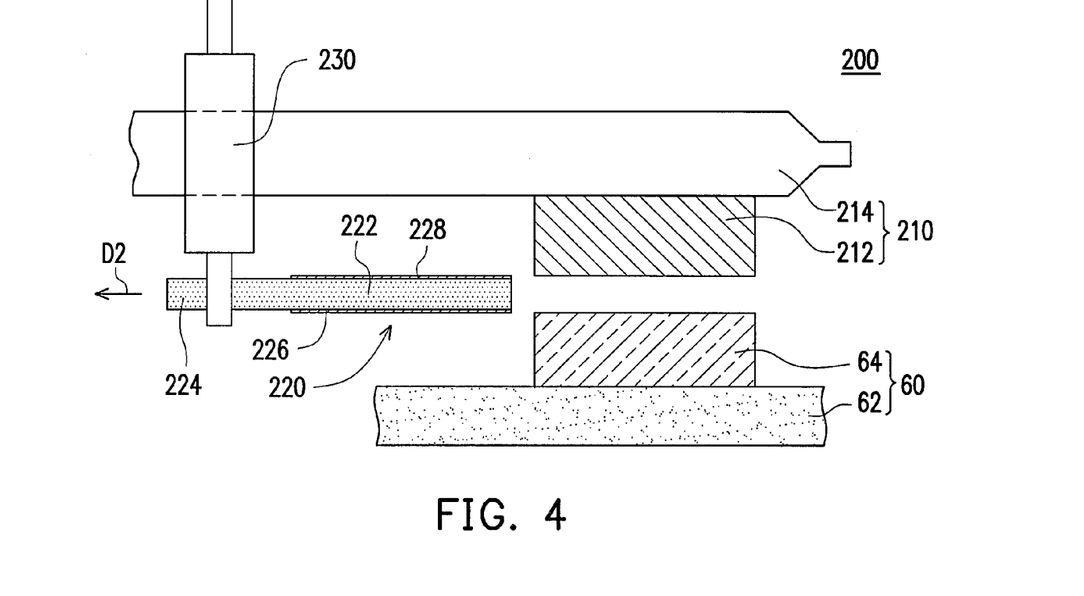
FIG. 4 is a schematic view showing a heat-conducting structure in FIG. 3, which is separated from a heat dissipation structure and a heat-generating structure.

FIG. 3 is a schematic cross-sectional view showing portion components of a heat dissipation module according to the other embodiment of the present invention. FIG. 4 is a schematic view showing a heat-conducting structure in FIG. 3, which is separated from a heat dissipation structure and a heat-generating structure. As shown in FIG. 3 and FIG. 4, a heat dissipation module 200 of the present embodiment comprises a heat dissipation structure 210 and a heat-conducting structure 220. The heat-conducting structure 220 comprises an adhesive heat-conducting portion 222 and an extending portion 224. The adhesive heat-conducting portion 222 comprises a first adhesive layer 226 and a second adhesive layer 228. The heat-generating structure 60 and the heat dissipation structure 210 are adhered to the heat-conducting portion 112 through the first adhesive layer 226 and the second adhesive layer 228 respectively to form adhesive interfaces. The heat-generating structure 60 comprises a circuit board 62 and a heat-generating device 64 disposed on the circuit board 62. The heat generated by the heat-generating device 64 is transmitted to the heat dissipation structure 210 through the heat-conducting portion 222. The heat dissipation structure 210 comprises a heat sink 212 and a heat pipe 214. The heat sink 212 is adhered to the heat-conducting portion 222 and the heat pipe 214 is disposed on the heat sink 212.

The heat dissipation module 200 further comprises a slidable component 230 which is slidably disposed on the heat pipe 214 and connected to the extending portion 224. The slidable component 230 slides along the heat pipe 214 so as to drive the extending portion 224 moving along a direction D2. Accordingly, by pushing the slidable component 230 to move along the heat pipe 214, the user can pull the extending portion 224 along the direction D2 to drive the heat-conducting portion 222 to be deformed along a direction parallel to the adhesive interface (such as the first adhesive layer 226 or the second adhesive layer 228) so as to release the adhesion between the heat-conducting portion 222 and the heat-generating structure 60 and the adhesion between the heat-conducting portion 222 and the heat dissipation structure 210. Therefore, it is easy to separate the heat-conducting structure 220 from the heat-generating structure 60 and the heat dissipation structure 210 (as shown in FIG. 4). Thus, it is easy to rework the heat dissipation module 200. With the different requirements of the manufacturing process, the heat-conducting structure 220 is detached from the heat-generating structure 60 but is still attached to the heat dissipation structure 210 after the heat-conducting structure 220 is forced to be deformed so as to speed up the rework of the heat dissipation module 200.

The materials of the first adhesive layer 226 and the second adhesive layer 228 can be, for example, the materials with relatively high thermal conductivity so that the heat dissipation efficiency of the heat dissipation module 200 can be improved. Furthermore, the first adhesive layer 226 and the second adhesive layer 228 can have the characteristics similar to or as same as the easily-removable characteristic of the traceless adhesive strip manufactured by 3M corporation so that it is easy to detach the aforementioned heat-conducting structure 220. With different requirements of the products, the first adhesive layer 226 and the second adhesive layer 228 can be made of the same materials or different materials, which does not limit the scope of the present invention.

Figure 5:
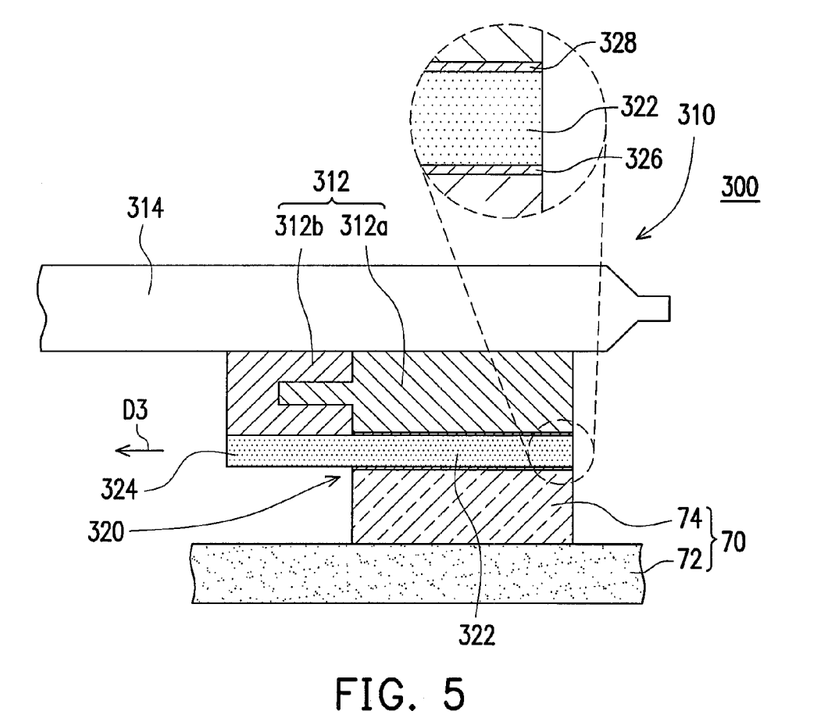
FIG. 5 is a schematic cross-sectional view showing portion components of a heat dissipation module according to the other embodiment of the present invention.
Figure 6:
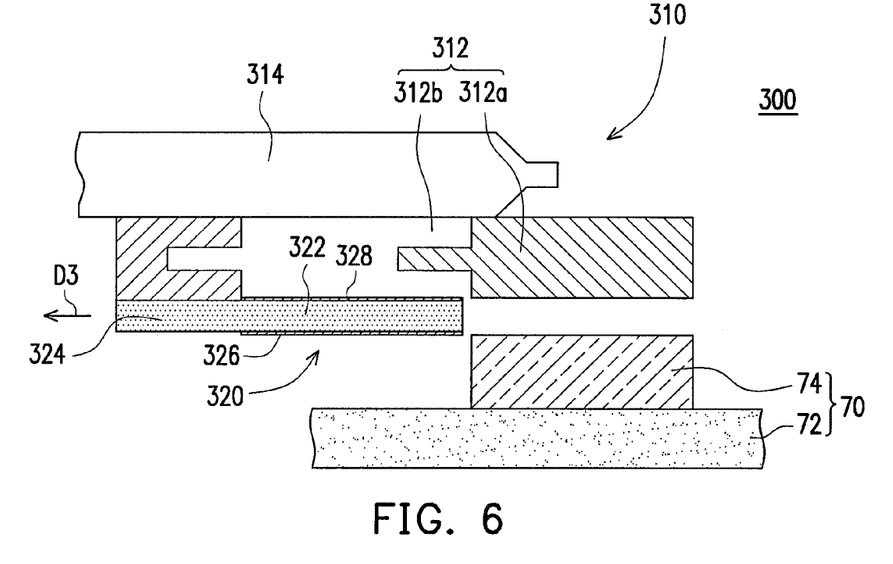
FIG. 6 is a schematic view showing a heat-conducting structure in FIG. 5, which is separated from a heat dissipation structure and a heat-generating structure.

FIG. 5 is a schematic cross-sectional view showing portion components of a heat dissipation module according to the other embodiment of the present invention. FIG. 6 is a schematic view showing a heat-conducting structure in FIG. 5, which is separated from a heat dissipation structure and a heat-generating structure. As shown in FIG. 5 and FIG. 6, a heat dissipation module 300 of the present embodiment comprises a heat dissipation structure 310 and a heat-conducting structure 320. The heat-conducting structure 320 comprises an adhesive heat-conducting portion 322 and an extending portion 324. The adhesive heat-conducting portion 322 comprises a first adhesive layer 326 and a second adhesive layer 328. The heat-generating structure 70 and the heat dissipation structure 310 are adhered to the heat-conducting portion 322 through the first adhesive layer 326 and the second adhesive layer 328 respectively to form adhesive interfaces. The heat-generating structure 70 comprises a circuit board 72 and a heat-generating device 74 disposed on the circuit board 72. The heat generated by the heat-generating device 74 is transmitted to the heat dissipation structure 310 through the heat-conducting portion 322. The heat dissipation structure 310 comprises a heat sink 312 and a heat pipe 314. The heat sink 312 is adhered to the heat-conducting portion 322 and the heat pipe 314 is disposed on the heat sink 312.

The heat sink 312 of the present embodiment comprises a first embedded portion 312a and a second embedded portion 312b. The first embedded portion 312a is adhered to the heat-conducting portion 322. The second embedded portion 312b is connected to the extending portion 324 and is embedded in the first embedded portion 312a, wherein the second embedded portion 312b is forced to drive the extending portion 324 moving along a direction D3. Accordingly, by moving the second embedded portion 312b, the user can pull the extending portion 324 along the direction D3 to drive the heat-conducting portion 322 to be deformed along a direction parallel to the adhesive interface (such as the first adhesive layer 326 or the second adhesive layer 328) so as to release the adhesion between the heat-conducting portion 322 and the heat-generating structure 70 and the adhesion between the heat-conducting portion 322 and the heat dissipation structure 310. Therefore, it is easy to separate the heat-conducting structure 320 from the heat-generating structure 70 and the heat dissipation structure 310 (as shown in FIG. 6). Thus, it is easy to rework the heat dissipation module 300. With different requirements of the manufacturing processes, the heat-conducting structure 320 is detached from the heat-generating structure 70 but is still attached to the heat dissipation structure 310 after the heat-conducting structure 320 is forced to be deformed so as to speed up the rework of the heat dissipation module 300.

The materials of the first adhesive layer 326 and the second adhesive layer 328 can be, for example, the materials with relatively high thermal conductivity so that the heat dissipation efficiency of the heat dissipation module 300 can be improved. Furthermore, the first adhesive layer 326 and the second adhesive layer 328 can have the characteristics similar to or as same as the easily-removable characteristic of the traceless adhesive strip manufactured by 3M corporation so that it is easy to detach the aforementioned heat-conducting structure 320. With different requirements of the products, the first adhesive layer 326 and the second adhesive layer 328 can be made of the same materials or different materials, which does not limit the scope of the present invention.

Figure 7:
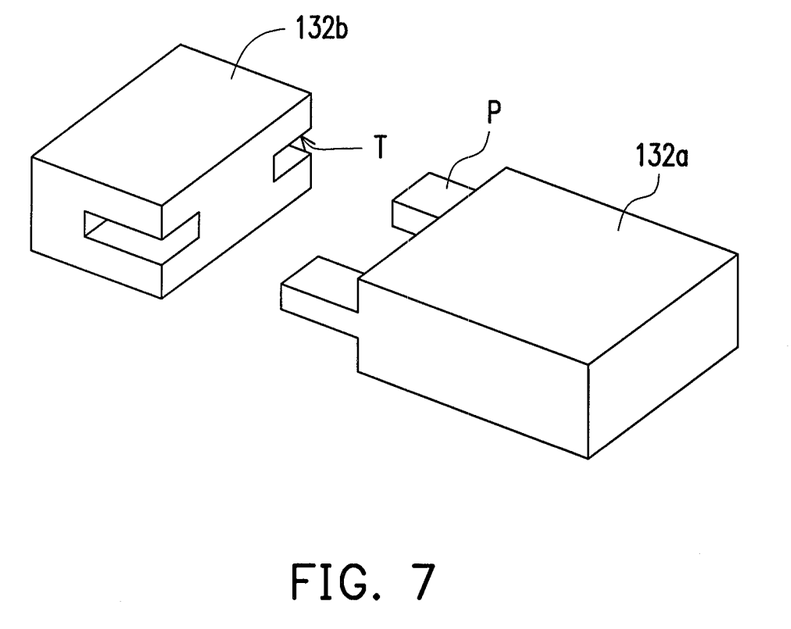
FIG. 7 is a schematic three-dimensional view of a heat sink in FIG. 6.

FIG. 7 is a schematic three-dimensional view of a heat sink in FIG. 6. As shown in FIG. 7, specifically, the first embedded portion 312a of the present embodiment has at least a protrudent column P (there are two protrudent column P in FIG. 7), and the second embedded portion 312b has at least a recess T. The protrudent column P is embedded in the recess T so that the contact area between the first embedded portion 312a and the second embedded portion 312b is increased to enhance the heat dissipation efficiency and the relative positions of the first embedded portion 312a and the second embedded portion 312b are fixed.

Figure 8:
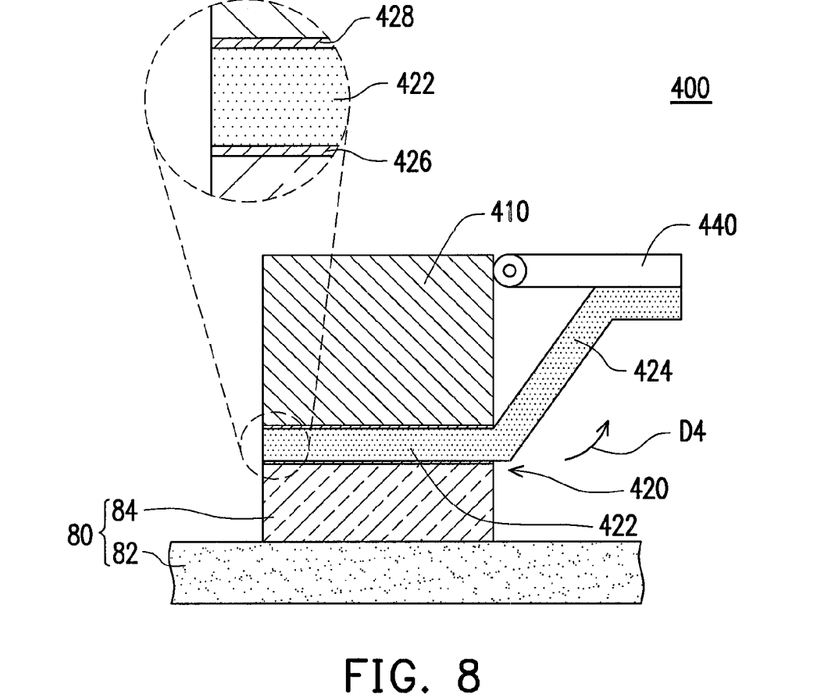
FIG. 8 is a schematic cross-sectional view showing portion components of a heat dissipation module according to the other embodiment of the present invention.
Figure 9:
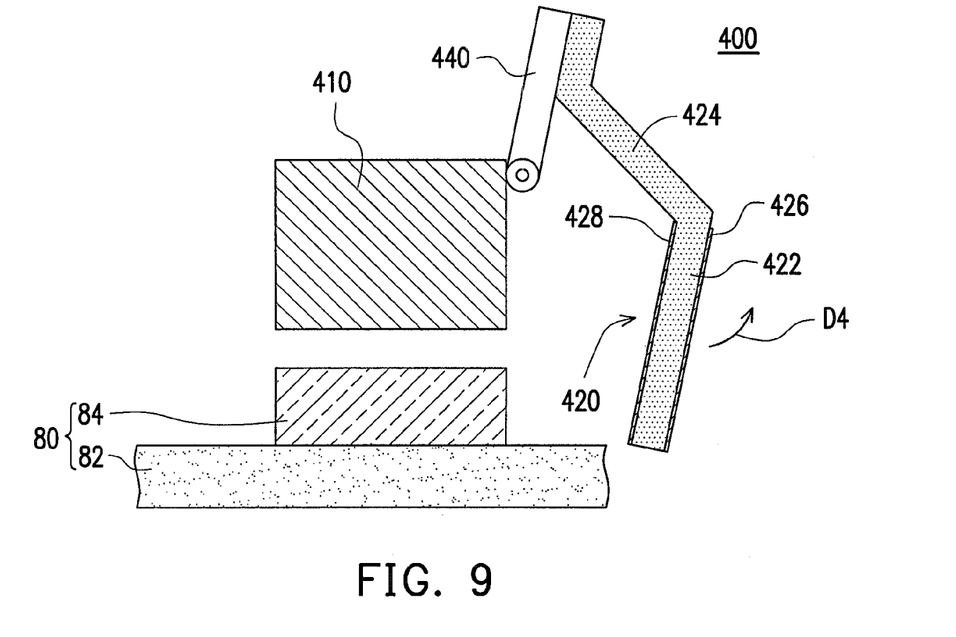
FIG. 9 is a schematic view showing a heat-conducting structure in FIG. 8, which is separated from a heat dissipation structure and a heat-generating structure.

FIG. 8 is a schematic cross-sectional view showing portion components of a heat dissipation module according to the other embodiment of the present invention. FIG. 9 is a schematic view showing a heat-conducting structure in FIG. 8, which is separated from a heat dissipation structure and a heat-generating structure. As shown in FIG. 8 and FIG. 9, a heat dissipation module 400 of the present embodiment comprises a heat dissipation structure 410 and a heat-conducting structure 420. The heat-conducting structure 420 comprises an adhesive heat-conducting portion 422 and an extending portion 424. The adhesive heat-conducting portion 422 comprises a first adhesive layer 426 and a second adhesive layer 428. The heat-generating structure 80 and the heat dissipation structure 410 are adhered to the heat-conducting portion 422 through the first adhesive layer 426 and the second adhesive layer 428 respectively. The heat-generating structure 80 comprises a circuit board 82 and a heat-generating device 84 disposed on the circuit board 82. The heat generated by the heat-generating device 84 is transmitted to the heat dissipation structure 410 through the heat-conducting portion 422.

In the present embodiment, the heart dissipation module 400 further comprises a hinge component 440 hinged to the heat dissipation structure 410 and connected to the extending portion 424. The hinge component 440 pivots relatively to the heat dissipation structure 410 so as to drive the extending portion 424 moving along a direction D4. Accordingly, by pushing the hinge 440 to pivot relatively to the heat dissipation structure 410, the user can pull the extending portion 424 along the direction D4 to drive the heat-conducting portion 422 to be deformed along a direction parallel to the adhesive interface (such as the first adhesive layer 426 or the second adhesive layer 428) so as to release the adhesion between the heat-conducting portion 422 and the heat-generating structure 80 and the adhesion between the heat-conducting portion 422 and the heat dissipation structure 410. Therefore, it is easy to separate the heat-conducting structure 420 from the heat-generating structure 80 and the heat dissipation structure 410 (as shown in FIG. 9). Thus, it is easy to rework the heat dissipation module 400. With different requirements of the manufacturing processes, the heat-conducting structure 420 is detached from the heat-generating structure 80 but is still attached to the heat dissipation structure 410 after the heat-conducting structure 420 is forced to be deformed so as to speed up the rework of the heat dissipation module 400.

The materials of the first adhesive layer 426 and the second adhesive layer 428 can be, for example, the materials with relatively high thermal conductivity so that the heat dissipation efficiency of the heat dissipation module 400 can be improved. Furthermore, the first adhesive layer 426 and the second adhesive layer 428 can have the characteristics similar to or as same as the easily-removable characteristic of the traceless adhesive strip manufactured by 3M corporation so that it is easy to detach the aforementioned heat-conducting structure 420. With different requirements of the products, the first adhesive layer 426 and the second adhesive layer 428 can be made of the same materials or different materials, which does not limit the scope of the present invention.

Figure 10A:
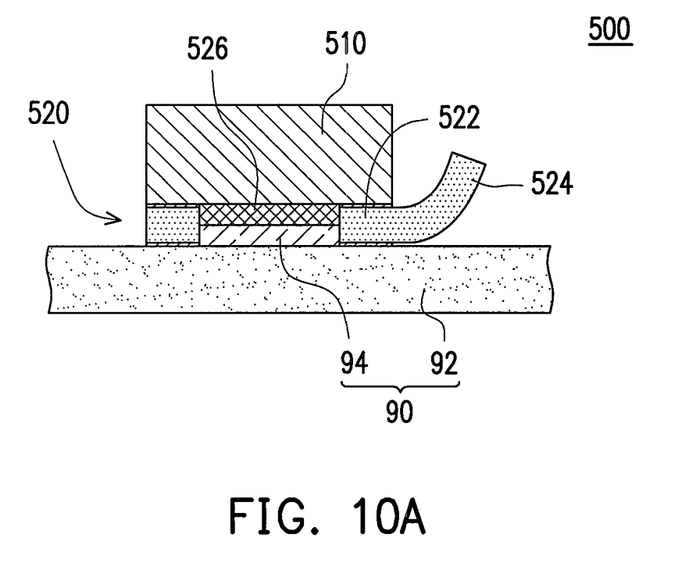
FIG. 10A is a schematic cross-sectional view showing a heat dissipation module according to one embodiment of the present invention.
Figure 10B:
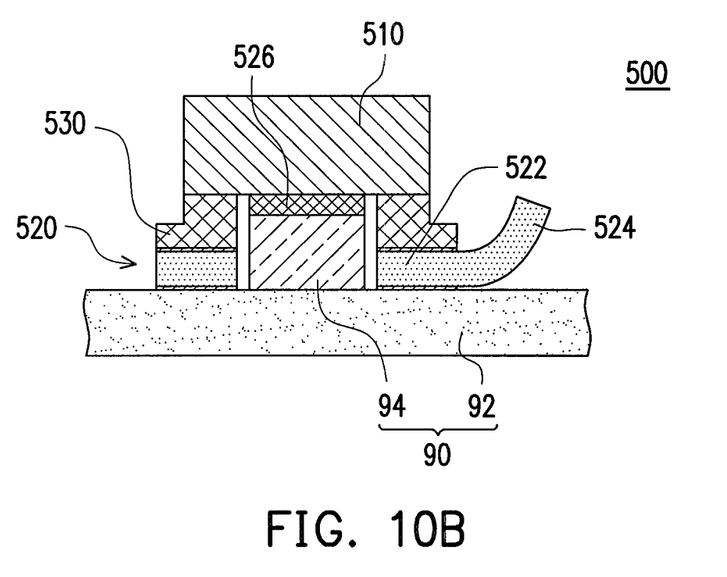
FIG. 10B is a schematic cross-sectional view showing a heat dissipation module according to another embodiment of the present invention.

FIG. 10A is a schematic cross-sectional view showing a heat dissipation module according to one embodiment of the present invention. As shown in FIG. 10A, in the heat dissipation module 500 of the present embodiment, the heat-generating structure 90 comprises a circuit board 92 and a heat-generating device 94 disposed on the circuit board 92. Besides the heat-conducting portion 522 adhered between the heat-generating structure 90 and the heat dissipation structure 510 and the extending portion 524 connected to the heat-conducting portion 522, the heat-conducting structure 520 further comprises a heat-conducting layer 526. The heat-conducting layer 526 is disposed between the heat-generating device 94 and the heat dissipation structure 510, and the material of heat-conducting layer 526 can be, for example, the material with relatively high thermal conductivity. Generally, the heat-conducting layer 526 is made of thermal glue for transmitting heat of the heat-generating device 94 to the heat dissipation structure 510. Therefore, the heat generated by the heat-generating structure 90 can be transmitted to the heat dissipation structure 510 through both of the heat-conducting portion 522 and the heat-conducting layer 526 to enhance the heat dissipation efficiency. The heat transmission rate of the heat-conducting layer 526 is larger than that of the heat-conducting portion 522, however, the heat-conducting layer 526 usually does not possess fixing ability. Thus, in the conventional technique, it is necessary to fix the heat dissipation structure 510 onto the heat-generating device 94 with the use of the screws. In the present invention, the heat-conducting layer 526 is used with the heat-conducting portion 522 having the fixing ability so that, without using any fixing structure, the heat dissipation structure 510 can be fixed on the heat-generating device 94. With the requirements of the product designs, an elastic element 530 can be assembled between the heat-conducting portion 522 and the heat dissipation structure 510 to adjust the height difference (as shown in FIG. 10B) between the heat-conducting portion 522 and the heat dissipation structure 510 due to the over large or small height of the heat-generating device 94. According to the various demands on the products, the heat-conducting layer 526 can be in contact with the heat-conducting portion 522 (as shown in FIG. 10A) or detached from the heat-conducting portion 522 (as shown in FIG. 10B).

Figure 11:
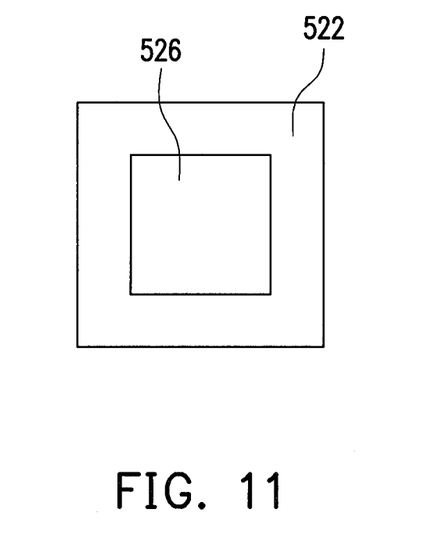
FIG. 11 is a top view of a heat-conducting portion and a heat-conducting layer in FIG. 10A.
Figure 12:
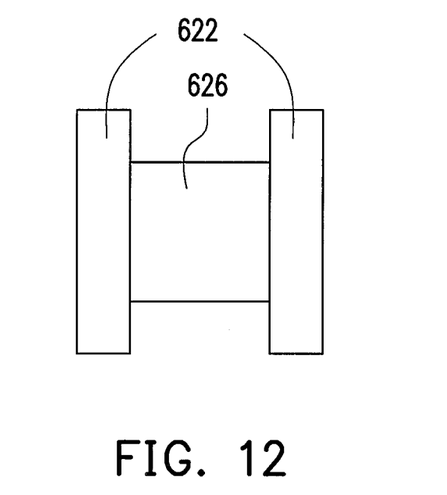
FIG. 12 is a top view of a heat-conducting portion and a heat-conducting layer according to another embodiment of the present invention.

FIG. 11 is a top view of a heat-conducting portion and a heat-conducting layer in FIG. 10A. As shown in FIG. 11, the heat-conducting layer 526 of the present embodiment can be disposed on the central region of the heat-conducting portion 522 so as to be surrounded by the heat-conducting portion 522. However, the present invention is not limited by the aforementioned embodiments. FIG. 12 is a top view of a heat-conducting portion and a heat-conducting layer according to another embodiment of the present invention. The heat-conducting layer 626 and the heat-conducting portion 622 can be configured in a way shown in FIG. 12.

Figure 13:
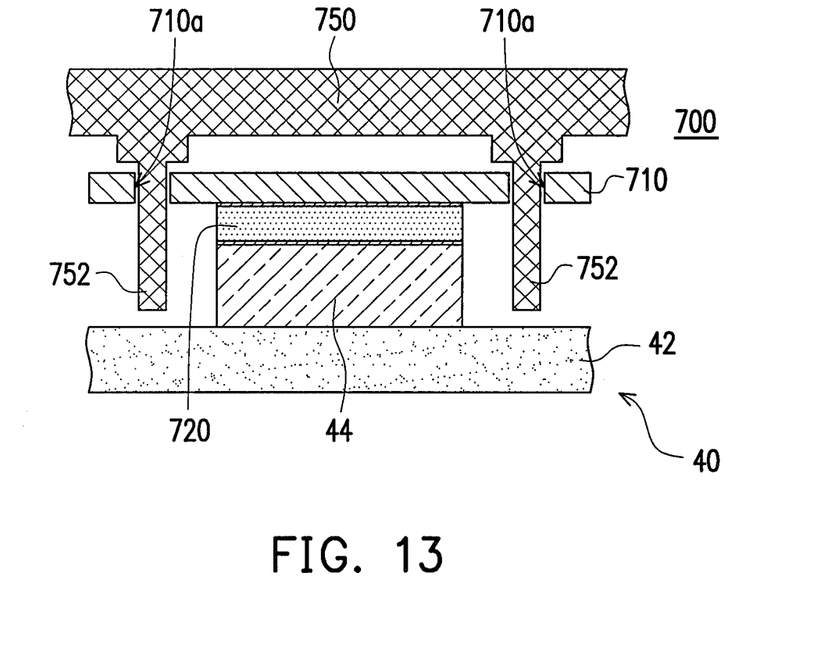
FIG. 13 is a schematic cross-sectional view showing a heat dissipation module according to the other embodiment of the present invention.

FIG. 13 is a schematic cross-sectional view showing a heat dissipation module according to the other embodiment of the present invention. As shown in FIG. 13, the heat dissipation module 700 of the present embodiment comprises a heat dissipation structure 710 and a heat-conducting structure 720. The heat-conducting structure 720 is adhered between the heat dissipation structure 710 and the heat-generating structure 40 so that the heat generated by the heat-generating structure 40 can be transmitted to the heat dissipation structure 710 through the heat-conducting structure 720. The heat dissipation structure 710 has at least a positioning hole 710a (there are a plurality of positioning holes 710a in the figure). The case body 750 (such as the top case body or the bottom case body) of the electronic apparatus has a positioning column 752 (there are a plurality of positioning column 46 in the figure). The positioning columns 752 are locked to the heat dissipation structure 710 through the positioning holes 710a respectively so that the heat dissipation structure 710 can be well fixed.

Accordingly, the heat-conducting structure of the present invention comprises the adhesive heat-conducting portion and the extending portion which are connected to each other, wherein the heat-conducting portion is adhered between the heat dissipation structure and the heat-generating structure, and the extending portion exposed to the heat dissipation structure and the heat-generating structure. The extending portion is forced to drive the heat-conducting portion to be deformed along a direction parallel to the adhesive interface (the first adhesive layer or the second adhesive layer) so that the adhesion between the heat-conducting portion and the extending portion and the adhesion between the heat-conducting portion and the heat dissipation structure are released. Accordingly, it is easy to detach the heat-conducting structure from the heat dissipation structure and the heat-generating structure so that it is easy to rework the heat dissipation module.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A heat dissipation module for an electronic apparatus having a heat-generating structure, the heat dissipation module comprising:
   a heat dissipation structure; and
   a heat-conducting structure, comprising:
      an adhesive heat-conducting portion adhered between the heat-generating structure and the heat dissipation structure, wherein the heat generated by the heat-generating structure is transmitted to the heat dissipation structure through the adhesive heat-conducting portion; and
      an extending portion connected to the adhesive heat-conducting portion and exposed to the heat-generating structure and the heat dissipation structure, wherein when the extending portion is forced to deform the adhesive heat-conducting portion adhered between the heat-generating structure and the heat dissipation structure along a direction parallel to an adhesive interface, an adhesion between the adhesive heat-conducting portion and the heat-generating structure is released and the heat-conducting structure is separated from the heat-generating structure due to deformation of the adhesive heat-conducting portion.

2. The heat dissipation module of claim 1, wherein the heat-generating structure comprises a circuit board and a heat-generating device disposed on the circuit board, and the adhesive heat-conducting portion comprises:
   a first adhesive layer disposed between the heat-generating device and the adhesive heat-conducting portion; and
   a second adhesive layer disposed between the heat dissipation structure and the adhesive heat-conducting portion.

3. The heat dissipation module of claim 1, wherein the heat dissipation structure comprises:
   a heat sink adhered to the adhesive heat-conducting portion; and
   a heat pipe disposed on the heat sink, wherein the heat generated by the heat-generating structure is transmitted to the heat pipe through the adhesive heat-conducting portion and the heat sink in sequence.

4. The heat dissipation module of claim 2, wherein the extending portion is forced to deform the adhesive heat-conducting portion along a direction parallel to the first adhesive layer, which leads to relief of the adhesion between the heat-conducting portion and the heat-generating structure.

5. The heat dissipation module of claim 2, wherein the extending portion is forced to deform the adhesive heat-conducting portion along a direction parallel to the second adhesive layer, which leads to relief of the adhesion between the heat-conducting portion and the heat-generating structure.

6. The heat dissipation module of claim 3, further comprising a slidable component slidably disposed on the heat pipe and connected to the extending portion, wherein the slidable component slides along the heat pipe so as to drive the extending portion.

7. The heat dissipation module of claim 3, wherein the heat sink comprises:
   a first embedded portion adhered to the adhesive heat-conducting portion; and
   a second embedded portion connected to the extending portion and embedded in the first embedded portion, wherein the second embedded portion is forced to drive the extending portion.

8. The heat dissipation module of claim 7, wherein the first embedded portion has at least a protrudent column, and the second embedded portion has at least a recess, and the protrudent is embedded in the recess.

9. The heat dissipation module of claim 1, further comprising a hinge component hinged to the heat dissipation structure and connected to the extending portion, wherein the hinge component pivots relatively to the heat dissipation structure so as to drive the extending portion.

10. The heat dissipation module of claim 1, wherein the heat-generating structure comprises a circuit board and a heat-generating device disposed on the circuit board, and the heat-conducting structure further comprises a heat-conducting layer disposed between the heat-generating device and the heat dissipation structure, wherein the heat-conducting layer is at least partially surrounded by the adhesive heat-conducting portion.

11. The heat dissipation module of claim 10, wherein the heat-conducting layer is a heat conductive glue and a heat conducting rate of the heat-conducting layer larger than a heat conducting rate of the adhesive heat-conducting portion.

12. The heat dissipation module of claim 1, wherein the heat-conducting structure further comprises an elastic element disposed between the adhesive heat-conducting portion and the heat dissipation structure.

13. The heat dissipation module of claim 1, wherein the electronic apparatus comprises a case body and the case body comprises a positioning column.

14. The heat dissipation module of claim 13, wherein the heat dissipation structure comprises a positioning hole, and the heat dissipation structure is fixed by the positioning column passing through the positioning hole.

* * * * *